(12) United States Patent
Park et al.

(10) Patent No.: US 7,385,348 B2
(45) Date of Patent: *Jun. 10, 2008

(54) DUAL PANEL TYPE ORGANIC ELECTROLUMINESCENT DISPLAY DEVICE AND METHOD OF FABRICATING THE SAME

(75) Inventors: Jae-Yong Park, Gyeonggi-do (KR); Kwan-Sou Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 398 days.

This patent is subject to a terminal disclaimer.

(21) Appl. No.: 10/878,519

(22) Filed: Jun. 29, 2004

(65) Prior Publication Data

US 2005/0140285 A1 Jun. 30, 2005

(30) Foreign Application Priority Data

Dec. 30, 2003 (KR) .................. 10-2003-0099919
Dec. 30, 2003 (KR) .................. 10-2003-0099937
Dec. 31, 2003 (KR) .................. 10-2003-0101281

(51) Int. Cl.
*H05B 33/04* (2006.01)
*H05B 33/08* (2006.01)
*H01L 51/50* (2006.01)

(52) U.S. Cl. .................. 313/512; 313/503; 313/506; 313/504

(58) Field of Classification Search ........ 313/498–512; 257/40, 98–100
See application file for complete search history.

(56) References Cited

U.S. PATENT DOCUMENTS 6,175,345 B1  1/2001  Kuribayashi et al.

6,548,961 B2  4/2003  Barth et al.
6,798,132 B2 *  9/2004  Satake .................. 313/495
2002/0024096 A1  2/2002  Yamazaki et al.

(Continued)

FOREIGN PATENT DOCUMENTS

CN  1446032 A  10/2003

(Continued)

OTHER PUBLICATIONS

Y.J. Yoon et al., "Development of thin film getters for field emission display," *The Journal of Korea Vacuum Science & Technology*, vol. 3, No. 1, Apr. 1999, pp. 74-78.

*Primary Examiner*—Mariceli Santiago
(74) *Attorney, Agent, or Firm*—Morgan, Lewis & Bockius LLP

(57) ABSTRACT

A dual panel type organic electroluminescent display device includes first and second substrates facing and spaced apart from each other, an array element layer on an inner surface of the first substrate and including a thin film transistor, a connection pattern on the array element layer and electrically connected to the thin film transistor, a first electrode on an inner surface of the second substrate, a partition wall on the first electrode in a non-pixel area between adjacent pixel areas, an organic light-emitting layer on the first electrode in the pixel area, a second electrode on the organic light-emitting layer in the pixel area and electrically connected to the connection pattern, a moisture absorption layer on the partition wall, and a seal pattern between the first and second substrates along a peripheral portion.

13 Claims, 16 Drawing Sheets

U.S. PATENT DOCUMENTS

| | | |
|---|---|---|
| 2002/0158577 A1 | 10/2002 | Shimoda et al. |
| 2003/0160564 A1 | 8/2003 | Park et al. |
| 2003/0178936 A1 | 9/2003 | Park et al. |
| 2003/0201445 A1 | 10/2003 | Park et al. |
| 2003/0201712 A1 | 10/2003 | Park et al. |
| 2003/0205763 A1 | 11/2003 | Park et al. |
| 2004/0031959 A1 | 2/2004 | Park et al. |

FOREIGN PATENT DOCUMENTS

| | | |
|---|---|---|
| EP | 1 351 323 | 10/2003 |
| JP | 2001-177509 | 4/2001 |
| JP | 2002-151253 | 5/2002 |
| JP | 2002-324662 | 11/2002 |
| JP | 2003-031355 | 1/2003 |
| JP | 15-257666 | 9/2003 |
| JP | 2003-257666 | 9/2003 |
| JP | 2003-297559 | 10/2003 |
| JP | 15-332064 | 11/2003 |
| JP | 2003-332064 | 11/2003 |
| JP | 2003332064 A * | 11/2003 |
| KR | 2002-0047889 | 6/2002 |
| KR | 2003-0075771 | 9/2003 |
| KR | 2003-0079603 | 10/2003 |
| KR | 2003-0086167 | 11/2003 |
| KR | 2004-0015935 | 2/2004 |
| KR | 2004-0079476 | 9/2004 |
| WO | WO-02/078101 | 10/2005 |

* cited by examiner

US 7,385,348 B2

DUAL PANEL TYPE ORGANIC ELECTROLUMINESCENT DISPLAY DEVICE AND METHOD OF FABRICATING THE SAME

The present invention claims the benefit of Korean Patent Application Nos. P2003-0099919 filed on Dec. 30, 2003, P2003-0099937 filed on Dec. 30, 2003, and P2003-0101281 filed on Dec. 31, 2003, all of which are hereby incorporated by reference.

BACKGROUND OF THE INVENTION

1. Field of the Invention

The present invention relates to an organic electroluminescent display device and method of fabricating the same, and more particularly, to a dual panel type organic electroluminescent display device and a method of fabricating the same.

2. Discussion of the Related Art

Among flat panel display devices, since an organic electroluminescent display device is self-luminescent and does not require an additional light source, the organic electroluminescent display device has a wide viewing angle, high contrast ratio, and a small size and is light weight, as compared to a liquid crystal display device. The organic electroluminescent display device also has a low power consumption. In addition, the organic electroluminescent display device is driven by a low direct current voltage and a short response time. Because all elements of the organic electroluminescent display device are solid, the organic electroluminescent display device can be used in a wide range of temperatures and is unlikely to be damaged by external impacts. Furthermore, the organic electroluminescent display device can have reduced manufacturing costs. Especially, the organic electroluminescent display device has simple manufacturing processes as compared with the liquid crystal display device or a plasma display panel, and only deposition and encapsulation apparatuses are used for manufacturing the organic electroluminescent display device.

FIG. 1 is a cross-sectional view of an organic electroluminescent display device according to the related art. In FIG. 1, the organic electroluminescent display device includes a first substrate 10 and a second substrate 60 facing the first substrate with a predetermined space therebetween. An array element layer AL is formed on an inner surface of the first substrate 10. The array element layer AL includes a thin film transistor T formed at each pixel region P, which is a minimum unit for an image. An organic electroluminescent diode E is formed on the array element layer AL. The organic electroluminescent diode E includes a first electrode 48, an organic light-emitting layer 54 and a second electrode 56 sequentially formed. Light emitted from the organic light-emitting layer 54 is transmitted toward a transparent electrode of the first and second electrodes 48 and 56. The organic electroluminescent display device is categorized into a top emission mode and a bottom emission mode depending on an emission direction. Here, the organic electroluminescent display device has the bottom emission mode, where the first electrode 48 is formed of a transparent material and the light emitted from the organic light-emitting layer 54 is transmitted through the first electrode 48.

The second substrate 60 serves as a sort of an encapsulation substrate. A concavity 62 is formed at an inner surface of the second substrate 60 and a desiccant 64 is disposed within the concavity 62. The desiccant 64 removes any external moisture that may permeate into a space between the first and second substrates 10 and 60 and protects the organic electroluminescent diode E. A seal pattern 70 is formed along peripheral portions of the first and second substrates 10 and 60 and seals the first and second substrates 10 and 60.

FIG. 2A is a plan view of a pixel for an organic electroluminescent display (OELD) device of the related art and FIG. 2B is a cross-sectional view along the line II-II of FIG. 2B. In FIGS. 2A and 2B, a buffer layer 12 is formed on a substrate 10, and a semiconductor layer 14 and a capacitor electrode 16 are formed on the buffer layer 10 with a space therebetween. A gate insulating layer 18 and a gate electrode 20 are sequentially formed on a center portion of the semiconductor layer 14. The semiconductor layer 14 includes an active area 14a corresponding to the gate electrode 20 and source and drain areas 14b and 14c disposed at both sides of the active area 14a. A gate line 22 in a first direction is also formed on the same layer as the gate electrode 20.

A first passivation layer 24 covers the gate electrode 20 and the capacitor electrode 16. A power electrode 26 is formed over the first passivation layer 24 corresponding to the capacitor electrode 16, and the power electrode 26 extends from a power supply line 28, which is formed in a second direction crossing the first direction.

A second passivation layer 30 is formed on an entire surface of the substrate 10 including the power electrode 26. The first and second passivation layers 24 and 30 include first and second contact holes 32 and 34 therethrough. The first contact hole 32 exposes the drain area 14c of the semiconductor layer 14 and the second contact hole 34 exposes the source area 14b of the semiconductor layer 14. The second passivation layer 30 also has a third contact hole 36 exposing a part of the power electrode 26.

A source electrode 38 and a drain electrode 40 are formed on the second passivation layer 30. The drain electrode 40 is connected to the drain area 14c of the semiconductor layer 14 through the first contact hole 32. The source electrode 38 is connected to the source area 14b of the semiconductor layer 14 through the second contact hole 34 and the power electrode 26 through the third contact hole 36.

As shown in FIG. 2A, a data line 42 is formed on the same layer as the source and drain electrodes 38 and 40 in the second direction. The data line 42 crosses the gate line 22 to define a pixel region P. A third passivation layer 44 covers the drain electrode 40 and the source electrode 38. The third passivation layer 44 has a drain contact hole 46 exposing a part of the drain electrode 40.

A light-emitting area EA is defined on the third passivation layer 44, and a first electrode 48 is formed in the light-emitting area EA. The first electrode 48 is connected to the drain electrode 40 through the drain contact hole 46. An inter insulating layer 50 is formed on the first electrode 48 and the third passivation layer 44. The inter insulating layer 50 exposes the main portion of the first electrode 48 and covers edges of the first electrode 48. An organic light-emitting layer 54 is formed on the first electrode 48 and the inter insulating layer 50 in the light-emitting area EA. A second electrode 56 is formed on an entire surface of the substrate 10 including the organic light-emitting layer 54.

The semiconductor layer 14, the gate electrode 20, the source electrode 38 and the drain electrode 40 constitute a thin film transistor. The thin film transistor of FIG. 2B is a driving thin film transistor Td. The driving thin film transistor Td is disposed between a switching thin film transistor Ts and the power supply line 28. The switching thin film transistor Ts is located at a crossing portion of the gate line 22 and the data line 42, and has the same structure as the driving thin film transistor Td.

Here, the gate electrode 20 of the driving thin film transistor Td is connected to the switching thin film transistor Ts and the drain electrode 40 of the driving thin film transistor Td is formed in an island shape. The switching thin film transistor Ts includes another gate electrode extending from the gate line 22 and another source electrode extending from the data line 42.

The power supply line 28 (including the power electrode 26) and the capacitor electrode 16 overlap each other to form a storage capacitor Cst.

The bottom emission mode OELD device is manufactured by attaching a substrate including array elements and organic luminescent diodes and another substrate for encapsulation. Since the yield of the OELD device depends on the yields of the array elements and the organic luminescent diodes, in the OELD device having the above structure, the whole processing yield is largely affected by the later organic luminescent diode process. Thus, even if the array elements are properly manufactured, if the organic light-emitting layer to be formed to a thickness of about 1,000 Å is improperly manufactured due to impurities or other factors, the resulting OELD device will be rejected as bad. In this case, all manufacturing costs and source materials required for the array elements are wasted, and the product yield is lowered.

Although the bottom emission mode OELD device has an excellent stability and a certain degree of freedom in its manufacturing processes, the bottom emission mode OELD device has a reduced aperture ratio. Thus, the bottom emission mode OELD device is not generally suitable for a high aperture device.

On the other hand, a top emission mode OELD device has a high aperture ratio, and is easy to manufacture. Additionally, the top emission mode OELD device has a long lifetime. However, in the top emission mode OELD device, since a cathode electrode is generally disposed over the organic light-emitting layer, a choice of material with which to make the cathode electrode is limited. Accordingly, the transmittance of light is limited, and a light-emitting efficacy is reduced. Furthermore, in order to improve the light transmittance, the passivation layer should be formed as a thin film, whereby the exterior moisture and air are not fully blocked.

SUMMARY OF THE INVENTION

Accordingly, the present invention is directed to a dual panel type organic electroluminescent display device and a method of fabricating the same that substantially obviate one or more of the problems due to limitations and disadvantages of the related art.

An object of the present invention is to provide a dual panel type organic electroluminescent display device and a method of fabricating the same having a high aperture ratio and high definition images.

Another object of the present invention is to provide a dual panel type organic electroluminescent display device and a method of fabricating the same having an improved yield and productivity.

Another object of the present invention is to provide a dual panel type organic electroluminescent display device and a method of fabricating the same that are reliable.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a dual panel type organic electroluminescent display device includes first and second substrates facing and spaced apart from each other, an array element layer on an inner surface of the first substrate and including a thin film transistor, a connection pattern on the array element layer and electrically connected to the thin film transistor, a first electrode on an inner surface of the second substrate, a partition wall on the first electrode in a non-pixel area between adjacent pixel areas, an organic light-emitting layer on the first electrode in the pixel area, a second electrode on the organic light-emitting layer in the pixel area and electrically connected to the connection pattern, a moisture absorption layer on the partition wall, and a seal pattern between the first and second substrates along a peripheral portion.

In another aspect, a dual panel type organic electroluminescent display device includes first and second substrates facing and spaced apart from each other, an array element layer on an inner surface of the first substrate and including a thin film transistor, a connection pattern on the array element layer and electrically connected to the thin film transistor, a first electrode on an inner surface of the second substrate, a partition wall on the first electrode in a non-pixel area between adjacent pixel areas, the partition wall including sub partition walls, each of which surrounds a pixel area, an organic light-emitting layer on the first electrode in the pixel area, a second electrode on the organic light-emitting layer in the pixel area and electrically connected to the connection pattern, a moisture absorption layer between adjacent sub partition walls, and a seal pattern between the first and second substrates along a peripheral portion.

In another aspect, a method of fabricating a dual panel type organic electroluminescent display device includes steps of forming an array element layer on a first substrate, the array element layer including a thin film transistor, forming a connection pattern on the array element layer, the connection pattern electrically connected to the thin film transistor, forming a first electrode on a second substrate, forming a partition wall on the first electrode in a non-pixel area between adjacent pixel areas, the partition wall having reversely tapered sides, forming an organic light-emitting layer on the first electrode in the pixel area, forming a second electrode on the organic light-emitting layer in the pixel area, forming a moisture absorption layer on the partition wall, and attaching the first and second substrates such that the second electrode is connected to the connection pattern, wherein the organic light-emitting layer and the second electrode are automatically patterned due to the partition wall.

In another aspect, a method of fabricating a dual panel type organic electroluminescent display device includes steps of forming an array element layer on a first substrate, the array element layer including a thin film transistor, forming a connection pattern on the array element layer, the connection pattern electrically connected to the thin film transistor, forming a first electrode on a second substrate, forming a partition wall on the first electrode in a non-pixel area between adjacent pixel areas, the partition wall having reversely tapered sides and including sub partition walls, each of which surrounds a pixel area, forming an organic light-emitting layer on the first electrode in the pixel area, forming a second electrode on the organic light-emitting layer in the pixel area, forming a moisture absorption layer between adjacent sub partition walls, and attaching the first and second substrates such that the second electrode is connected to the connection pattern, wherein the organic light-emitting layer and the second electrode are automatically patterned due to the partition wall.

In another aspect, a dual panel type organic electroluminescent display device includes first and second substrates facing and spaced apart from each other, an array element layer on an inner surface of the first substrate and including a thin film transistor, a connection pattern on the array element layer and electrically connected to the thin film transistor, a moisture absorption layer covering the array element layer and exposing the connection pattern, an organic electroluminescent diode on an inner surface of the second substrate and electrically connected to the connection pattern, and a seal pattern between the first and second substrates along a peripheral portion.

In another aspect, a method of fabricating a dual panel type organic electroluminescent display device includes steps of forming an array element layer on a first substrate, the array element layer including a thin film transistor, forming a connection pattern on the array element layer, the connection pattern electrically connected to the thin film transistor, forming a moisture absorption layer covering the array element layer and exposing the connection pattern, forming an organic electroluminescent diode on a second substrate, forming a seal pattern on one of the first substrate and the second substrate along a peripheral portion, and attaching the first and second substrates such that the electroluminescent diode is connected to the connection pattern.

In another aspect, a dual panel type organic electroluminescent display device includes first and second substrates facing and spaced apart from each other, a plurality of gate lines, a plurality of data lines and a plurality of power lines on the first substrate, the plurality of gate lines crossing the plurality of data lines and the plurality of power lines to define a plurality of pixel areas, a switching element at each pixel area, the switching element including a switching thin film transistor and a driving thin film transistor, a storage capacitor at each pixel area and connected to the switching element, a connection pattern electrically connected to the driving thin film transistor, a moisture absorption layer of a hygroscopic conductive material over the storage capacitor, an organic electroluminescent diode on an inner surface of the second substrate and including a first electrode, an organic light-emitting layer and a second electrode, wherein the organic electroluminescent diode is electrically connected to the connection pattern.

In another aspect, a dual panel type organic electroluminescent display device includes first and second substrates facing and spaced apart from each other, a pixel driving part on an inner surface of the first substrate, the pixel driving part including a metal line group and a thin film transistor, the metal line group including a gate line, a data line and a power line, the thin film transistor being activated by voltage applied by the metal line group, a connection pattern on the pixel driving part and electrically connected to the thin film transistor, an organic electroluminescent diode on an inner surface of the second substrate and electrically connected to the thin film transistor through the connection pattern, and a moisture absorption layer on the pixel driving part except areas corresponding to the metal line group and the thin film transistor, the moisture absorption layer including a hygroscopic conductive material.

In another aspect, a dual panel type organic electroluminescent display device includes first and second substrates facing and spaced apart from each other, a thin film transistor on an inner surface of the first substrate, a connection pattern connected to the thin film transistor, an organic electroluminescent diode on an inner surface of the second substrate and electrically connected to the thin film transistor through the connection pattern, and a moisture absorption layer on an inner surface of one of the first and second substrates.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
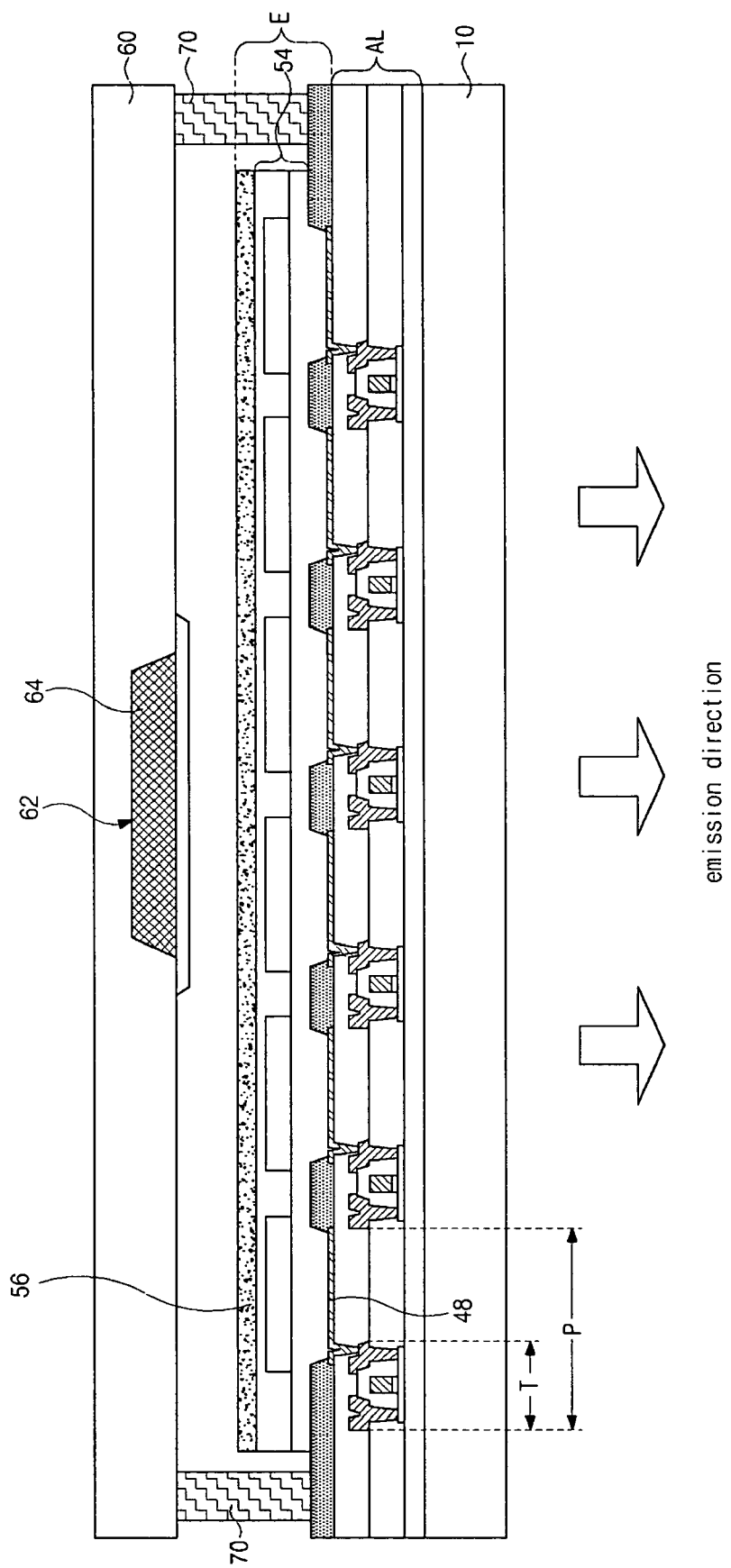
FIG. 1 is a cross-sectional view of an organic electroluminescent display device according to the related art.
Figure 2A:
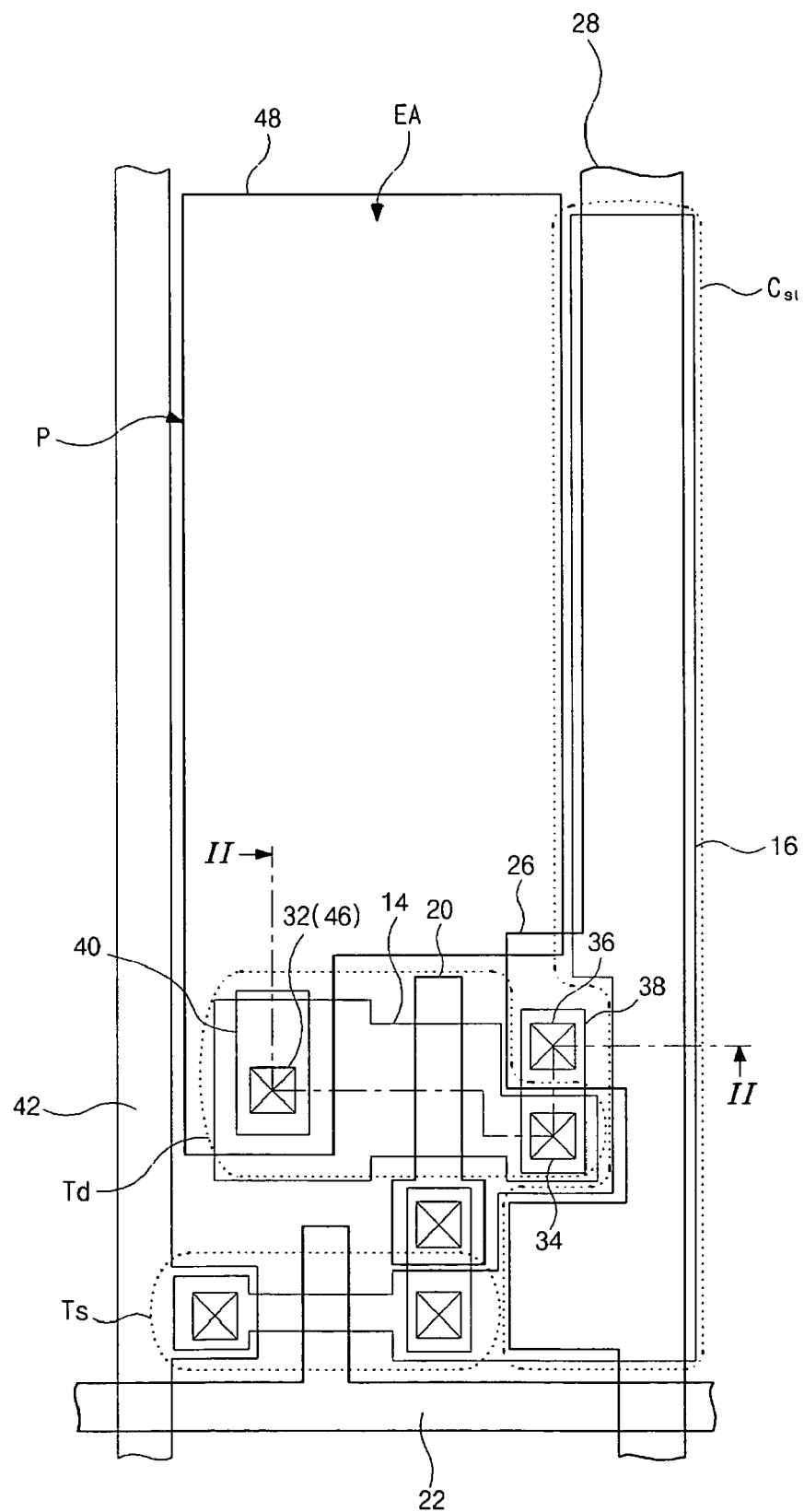
FIG. 2A is a plan view of a pixel for an organic electroluminescent display device of the related art.
Figure 2B:
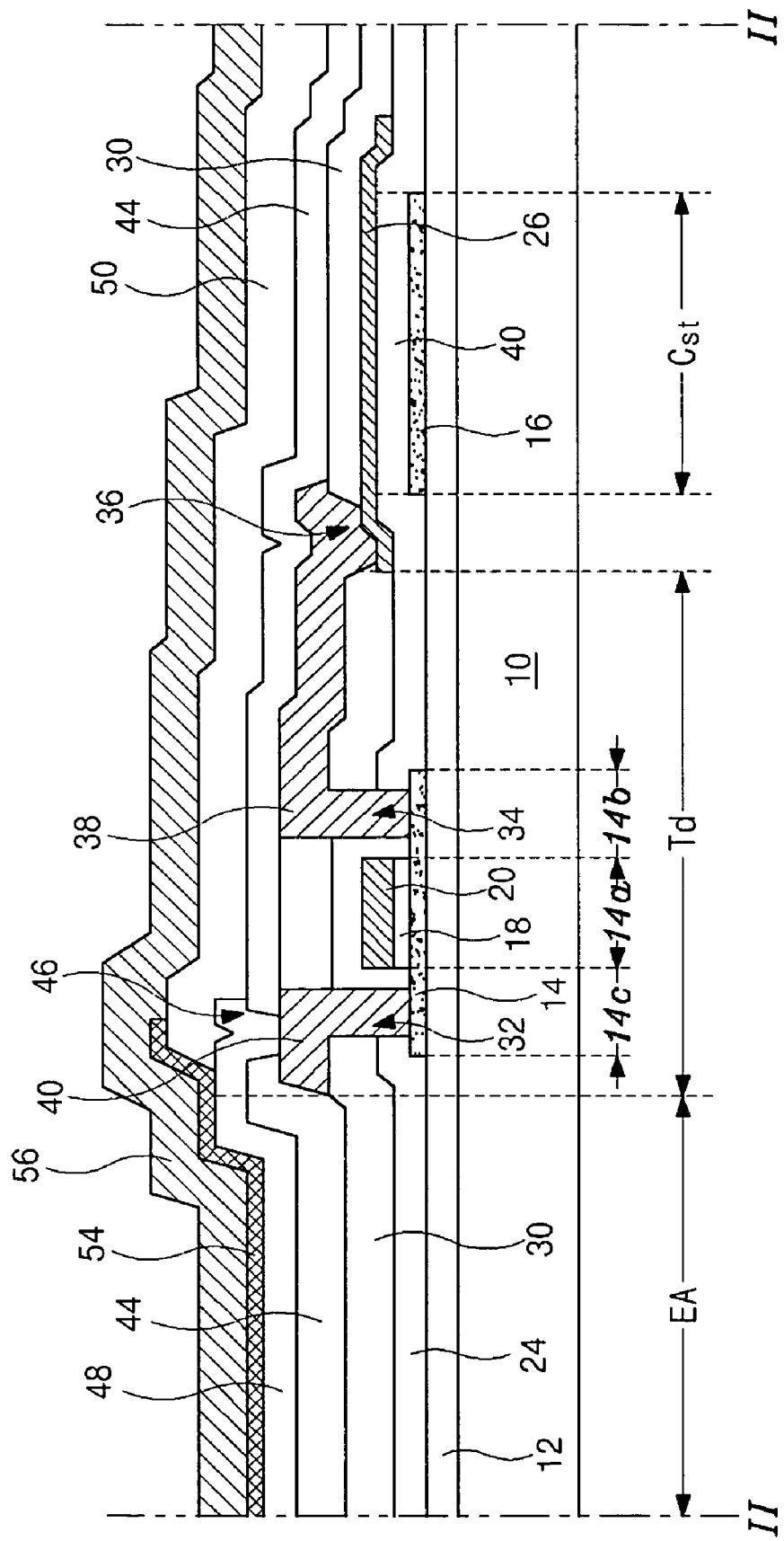
FIG. 2B is a cross-sectional view along the line II-II of FIG. 2B.
Figure 3:
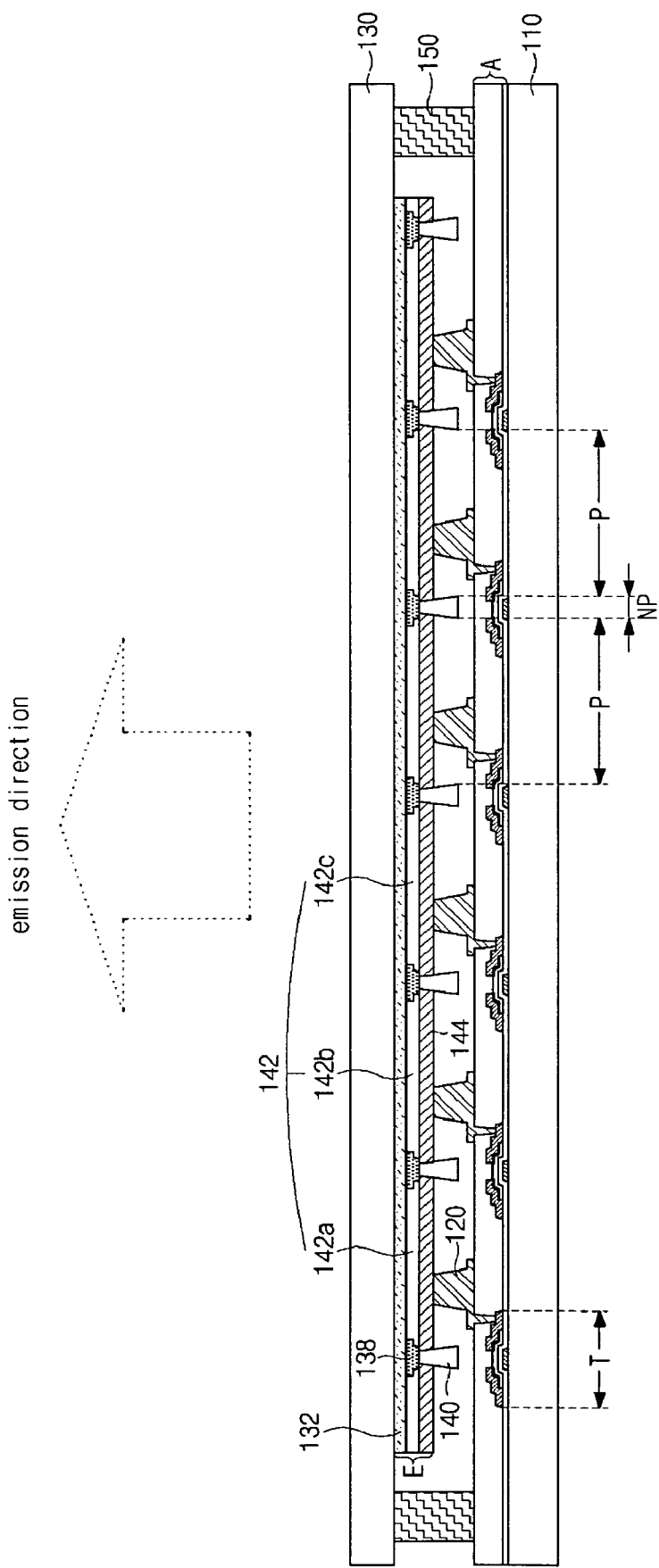
FIG. 3 is a cross-sectional view of a dual panel type organic electroluminescent display device according to a first embodiment of the present invention.

FIG. 3 is a cross-sectional view of a dual panel type organic electroluminescent display (OELD) device according to a first embodiment of the present invention. In FIG. 3, the dual panel type organic electroluminescent display (OELD) device includes a first substrate 110 and a second substrate 130 that are spaced apart and face each other. An array element layer A including a plurality of thin film transistors T is formed on an inner surface of the first substrate 110. A plurality of connection patterns 120 having a predetermined thickness are formed on the array element layer A. Each connection pattern 120 is connected to each thin film transistor T.

The predetermined thickness of the connection patterns 120 may be selected from a thickness range such that a pixel driving part and an emission part formed on different substrates are electrically connected to each other by the connection patterns 120. Thus, the thickness of the connection patterns 120 corresponds to a cell gap between the substrates 110 and 130.

The thin film transistors T of FIG. 3 may serve as a driving thin film transistor for providing an organic electroluminescent diode with currents and for controlling brightness of emitted light. The thin film transistors T may have an inverted staggered structure using amorphous silicon.

A first electrode 132 is formed on an entire inner surface of the second substrate 130, and an insulating pattern 138 and a partition wall 140 are sequentially formed on the first electrode 132 in a non-pixel area NP corresponding to a border portion between adjacent pixel areas P. The partition wall 140 is reversely tapered and has a certain thickness. An organic light-emitting layer 142 and a second electrode 144 are sequentially formed on the first electrode 132 between adjacent partition walls 140 and between adjacent insulating patterns 138. The organic light-emitting layer 142 and the second electrode 144 are patterned due to the partition wall 140, and do not require additional patterning processes. Thus, the total thickness of the partition wall 140 and the insulating pattern 138 is selected from a range such that the organic light-emitting layer 142 and the second electrode 144 are divided into each pixel area P by the partition wall 140 and the insulating pattern 138.

The organic light-emitting layer 142 includes red, green and blue luminous layers 142a, 142b and 142c, each of which corresponds to the respective pixel area P. The first and second electrodes 132 and 144 and the organic light-emitting layer 142 interposed therebetween form an organic electroluminescent diode E.

The first electrode 132 may be formed of a transparent material so that light emitted from the organic light-emitting layer 142 is transmitted through the first electrode 132 to display an image as a top emission mode. For example, if the first electrode 132 functions as an anode electrode and the second electrode 144 acts as a cathode electrode, the first electrode 132 may be formed of a transparent conductive material such as indium tin oxide (ITO).

The first and second substrates 110 and 130 are attached by a seal pattern 150 formed in peripheral portions of the substrates 110 and 130.

In the dual panel type OELD device of the first embodiment, since the array elements and the organic electroluminescent diodes are formed on different substrates, the yield and productivity are improved, and the lifetime of the device is effectively increased. Additionally, the thin film transistor is easily designed; a high aperture ratio and a high resolution are obtained; and its reliability is increased due to the top emission mode. Moreover, because the organic light-emitting layer and the second electrode are automatically patterned due to the partition wall without an additional shadow mask, the process efficiency is improved.

In the first embodiment, to display a full color image, red, blue green luminous layers, which emit red, green and blue light, respectively, are used. This may be referred to as an independent luminescent method. Although not shown in the figure, instead of the independent luminescent method, an additional full color element, such as a single structure of a color filter layer or a double structure of a color filter layer and color-changing mediums (CCM), may be used. In the device including such a full color element, the organic light-emitting layer emits only substantially monochromatic light, for example.

The dual panel type OELD device may have a problem that there is no additional space for fixing desiccant, which absorbs moisture within the device. More particularly, in the related art OELD device, since no element is formed on the upper substrate, the desiccant could be attached on the inner surface of the upper substrate. On the other hand, the dual panel type OELD device has no spare space for the desiccant because the pixel driving part and the emission part are formed on respective substrates.

Figure 4:
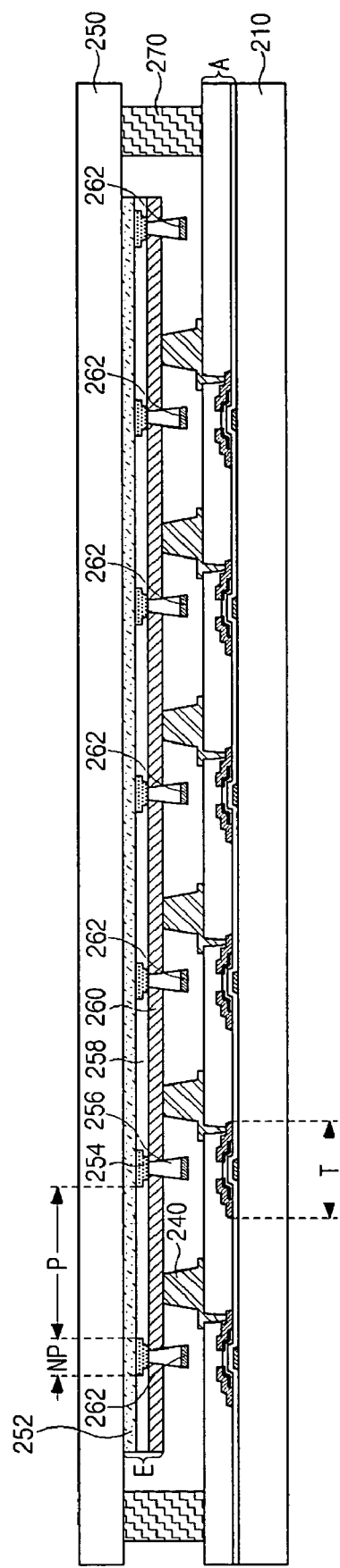
FIG. 4 is a cross-sectional view of a dual panel type organic electroluminescent display device according to a second embodiment of the present invention.

FIG. 4 is a cross-sectional view of a dual panel type organic electroluminescent display (OELD) device according to a second embodiment of the present invention. The parts different from the first embodiment will be mainly explained.

As illustrated in FIG. 4, the dual panel type OELD device includes a first substrate 210 and a second substrate 250 that are spaced apart and face each other. An array element layer A including a plurality of thin film transistors T is formed on an inner surface of the first substrate 210. A plurality of connection patterns 240 are formed on the array element layer A to be connected to the plurality of thin film transistors T.

A first electrode 252 is formed on an entire inner surface of the second substrate 250, and an insulating pattern 254 and a partition wall 256 are sequentially formed on the first electrode 252 in a non-pixel area NP corresponding to a border portion between adjacent pixel areas P, each of which is a minimum unit for an image. The partition wall 256 is reversely tapered and has a certain thickness. An organic light-emitting layer 258 and a second electrode 260 are sequentially formed on the first electrode 252 in the pixel area P, that is, between adjacent partition walls 256 and between adjacent insulating patterns 254. The organic light-emitting layer 258 and the second electrode 260 are automatically patterned due to the partition wall 256, and do not require additional patterning processes. Thus, the total thickness of the partition wall 256 and the insulating pattern 254 is selected from a range such that the organic light-emitting layer 258 and the second electrode 260 are divided into each pixel area P due to the partition wall 256.

The first electrode 252, the organic light-emitting layer 258, and the second electrode 260 constitute an organic electroluminescent diode E.

A seal pattern 270 is formed along peripheral portions of the first and second substrates 210 and 250 and seals the first and second substrates 210 and 250.

In this embodiment, a moisture absorption layer 262 is formed on the partition wall 256. The moisture absorption layer 262 may be formed of one of a hygroscopic oxide material such as calcium oxide (CaO) or barium oxide (BaO) and other hygroscopic insulating materials. If the moisture absorption layer 262 formed on the partition wall 256 has a conductive property, the adjacent electrodes 260 with the partition wall 256 therebetween may be shorted due to the moisture absorption layer 262. Thus, it is preferable that the moisture absorption layer 262 be made of an insulating material. The moisture absorption layer 262 may be formed by one of an inkjet method, a roll printing method, a screen printing method, and a bar coating method using a source material of a liquid phase.

In this embodiment, since the moisture absorption layer is formed on the partition wall, no additional space is required for installing the moisture absorption element. In the figure, although only two pixels including six pixel areas P are shown, the device includes more pixels. Thus, for the area of the moisture absorption layer is large as compared to the related art, and thus, the hygroscopic ability is improved.

Figure 5:
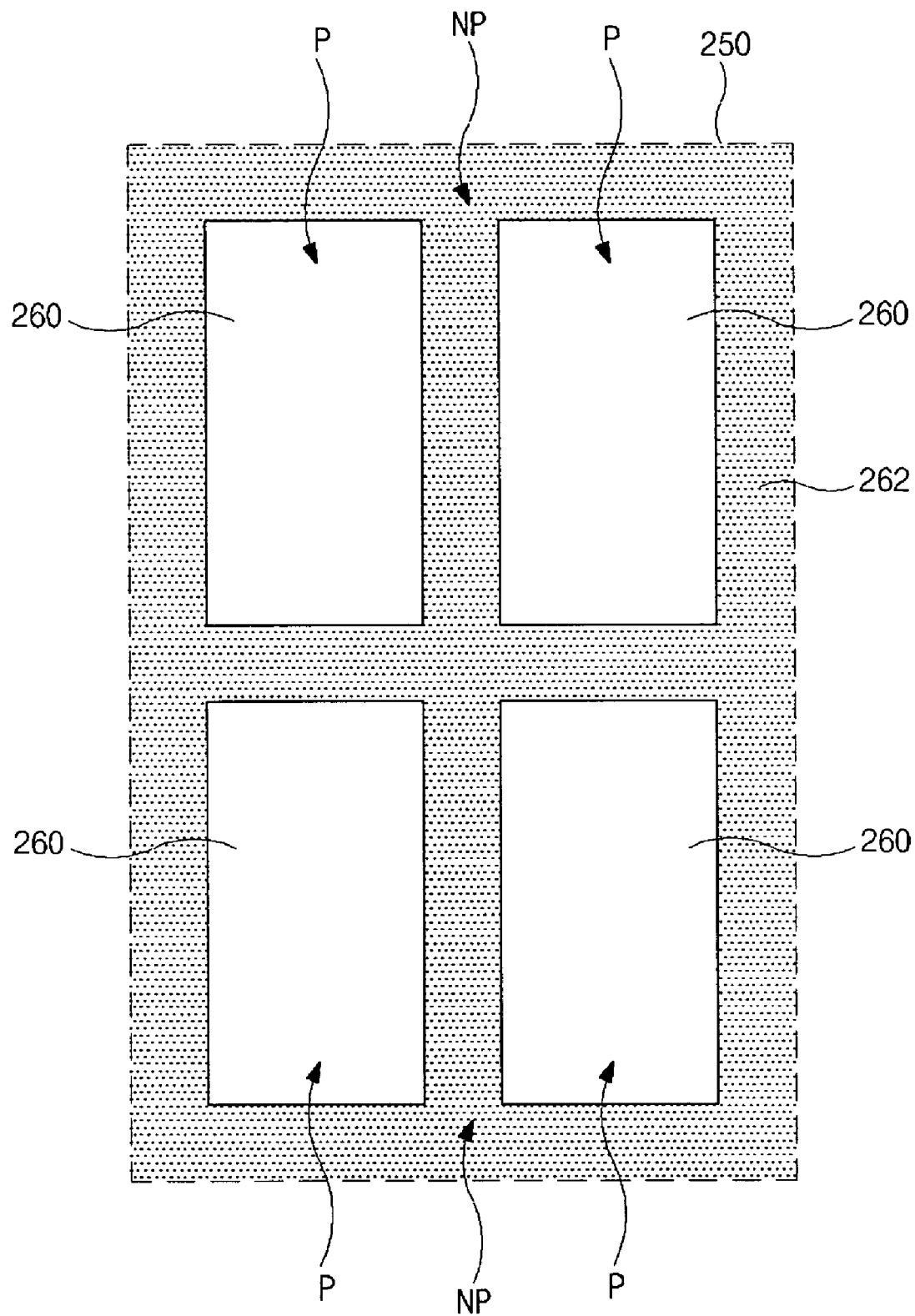
FIG. 5 is a schematic plan view of a substrate for the dual panel type organic electroluminescent display device according to the second embodiment of the present invention.

FIG. 5 is a schematic plan view of a substrate for the dual panel type OELD device according to the second embodiment of the present invention, and shows the second substrate including the moisture absorption layer.

In FIG. 5, a plurality of pixel areas P, each of which is a minimum unit for an image, is defined on a substrate 250 and spaced apart from each other. A space between the pixel areas P is referred to as a non-pixel area NP. A moisture absorption layer 262 is formed corresponding to the non-pixel area NP.

An insulating pattern 254 and a partition wall 256 of FIG. 4 are sequentially formed under the moisture absorption layer 262. In fact, the moisture absorption layer 262 is separated from a second electrode 260 formed in the pixel area P due to a thickness of the partition wall 256.

Figure 6A:
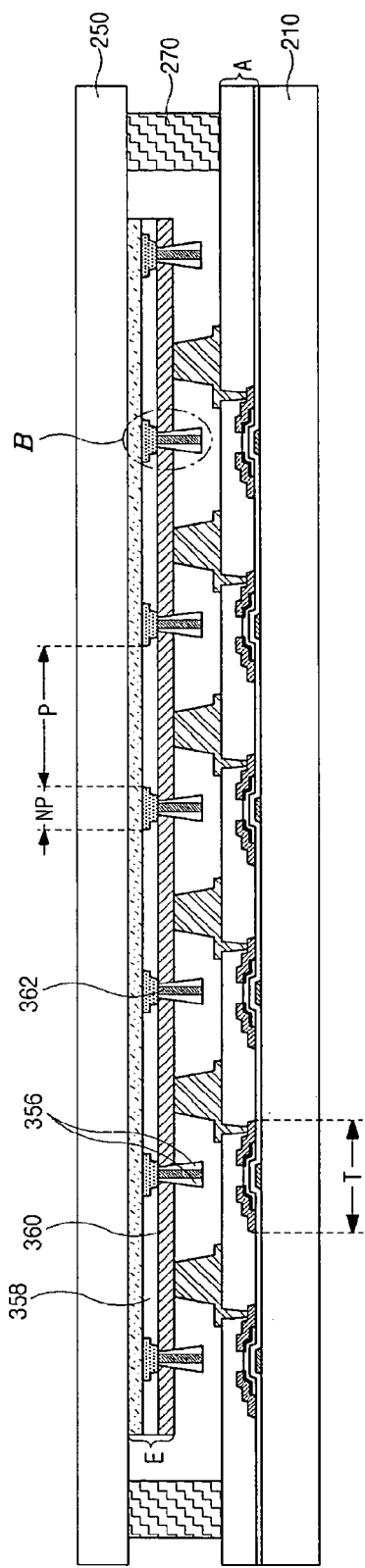
FIG. 6A is a cross-sectional view of a dual panel type organic electroluminescent display device according to a third embodiment of the present invention.
Figure 6B:
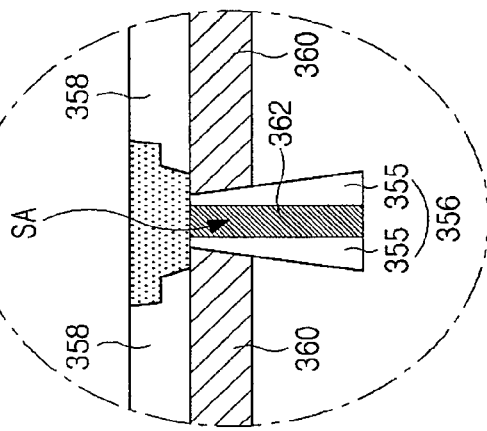
FIG. 6B is a view magnifying the region B of FIG. 6A.
Figure 6C:
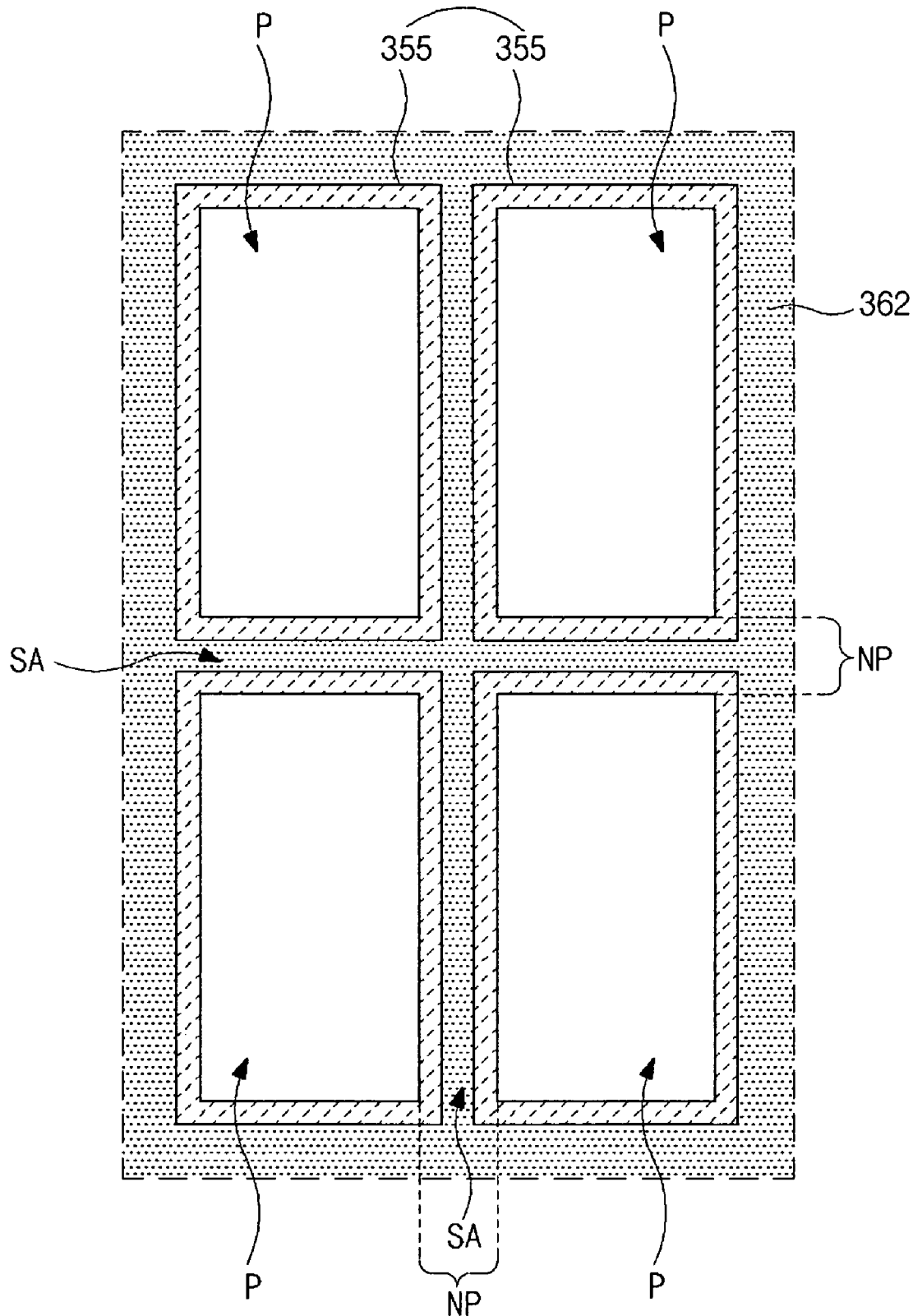
FIG. 6C is a plan view of a substrate for the dual panel type organic electroluminescent display device.

FIGS. 6A to 6C show a dual panel type OELD device according to a third embodiment of the present invention. FIG. 6A is a cross-sectional view of the dual panel type OELD device, FIG. 6B is a view magnifying the region B of FIG. 6A, and FIG. 6C is a plan view of a substrate for the dual panel type OELD device. The parts different from the first embodiment will be explained.

In this embodiment, a sub partition wall 355 of a square frame shape surrounds a pixel area P. In a non-pixel area NP between the pixel areas P, adjacent sub partition walls 355, which are spaced apart from each other, form a double partition wall 356. In this embodiment, because an organic light-emitting layer 358 and a second electrode 360 are also divided by the double partition wall 356, which includes a standoff area SA, the second electrode 360 is securely separated as compared with the single partition wall of the previous embodiments.

Here, a moisture absorption layer 362 is formed in the standoff area SA in the double partition wall 356. A width and a thickness of the moisture absorption layer 362 depend on a width and a thickness of the standoff area SA. According to the third embodiment, the structure of the moisture absorption layer 362 is more stable than that of the second embodiment, and the moisture absorption layer 362 is formed in the standoff area SA, thereby reducing the problem that other layers may be damaged by the moisture absorption layer 362. Additionally, it is easy to improve the hygroscopic ability by controlling the dimensions of the standoff area SA.

Reverse-tapered sides of the double partition wall 356 correspond to inner sides of the sub partition walls 355 enclosing the pixel areas P, respectively. In the standoff area SA between the sub partition walls 355, the moisture absorption layer 362 is formed. The structure that outer sides of the sub partition walls 355 (that face the standoff area SA) are vertical with respect to the substrate facilitates the manufacture of the device. The moisture absorption layer 362 may be formed of the same material and through the same process as the second embodiment.

Although not described in the second and third embodiments, the organic light-emitting layer and the second electrode are formed in the most outer area of the partition wall. A deposition order of the organic light-emitting layer and the second electrode with the moisture absorption layer depends on the manufacturing process.

Figure 7:
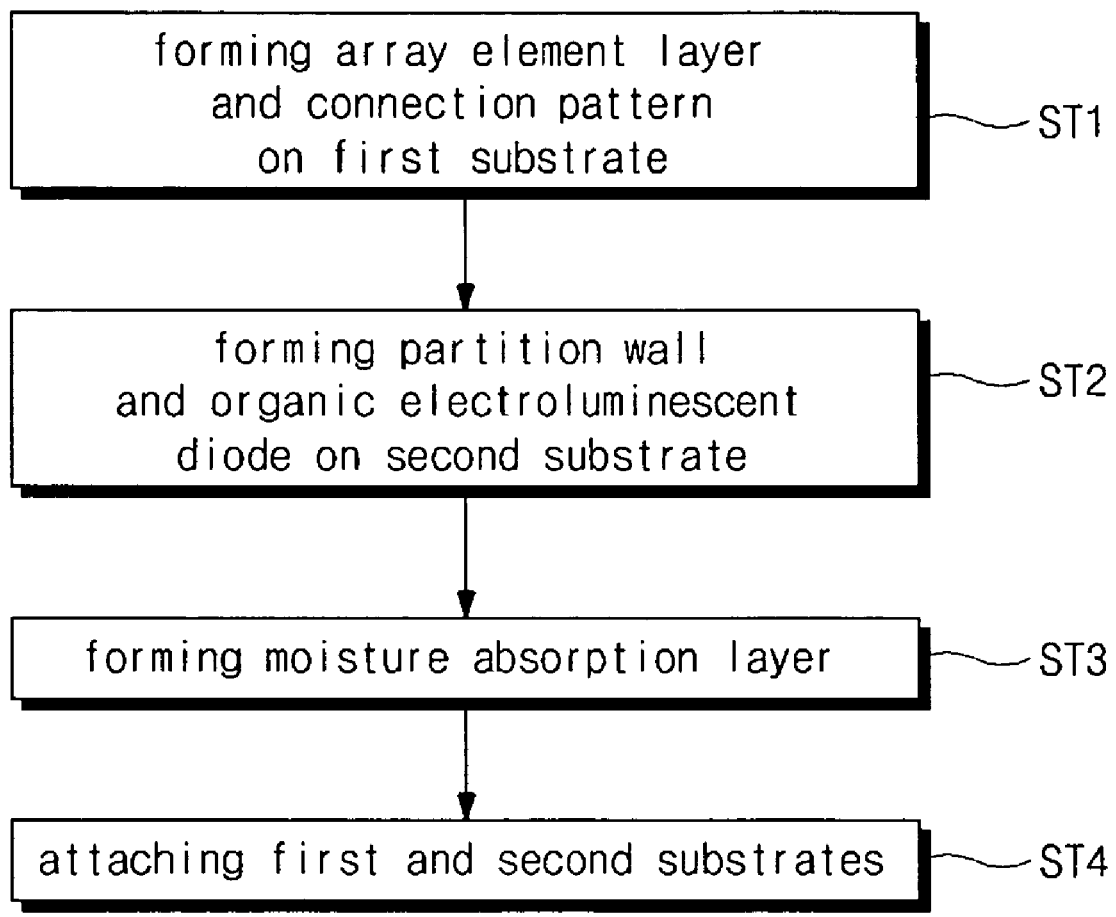
FIG. 7 is a flow chart illustrating a manufacturing process of an example of a dual panel type organic electroluminescent display device according to the present invention.

FIG. 7 is a flow chart illustrating a manufacturing process of a dual panel type OELD device according to the present invention.

At step ST1, an array element layer including a plurality of thin film transistors is formed on a first substrate and a plurality of connection patterns are formed on the array element layer. Each connection pattern is connected to the respective thin film transistor.

The array element layer also includes a plurality of gate lines, data lines and power lines. The thin film transistors include a switching thin film transistor that is formed at a crossing portion of the gate and data lines and a driving thin film transistor that is connected to a drain electrode of the switching thin film transistor and the power line. The driving thin film transistor provides the organic electroluminescent diode with currents. In the examples above, the aforementioned thin film transistors indicate the driving thin film transistor.

The plurality of connection patterns is at least in part formed of a conductive material. Each connection pattern may include a projected pattern of an organic material and a connecting electrode covering the projected pattern and connected to the thin film transistor. The connection pattern may be connected to the thin film transistor through another electrode.

At step ST2, a first electrode is formed on an entire surface of a second substrate. Subsequently, an insulating pattern and a partition wall are formed on the first electrode in a non-pixel area. The partition wall has a predetermined thickness and has reversely tapered sides. Then, an organic light-emitting layer and a second electrode are formed. They are automatically patterned due to the partition wall. The first electrode, the organic light-emitting layer, and the second electrode constitute an organic electroluminescent diode.

The partition wall may have a single structure or a double structure. In the case of the double structure with sub partition walls, the organic light-emitting layer material and the second electrode material are formed between sub partition walls.

In an independent luminescent method, the organic light-emitting layer includes red, green and blue luminous materials. In the case of using an additional full color element such as color filter, the organic light-emitting layer includes a monochromatic luminous material, for example.

At step ST3, a moisture absorption layer is formed. In the single structure, the moisture absorption layer is formed on the partition wall, and in the double structure, the moisture absorption layer is formed in a standoff area between sub partition walls. The formation of the moisture absorption layer includes selectively coating a source material of a liquid phase on the partition wall or in the standoff area between the sub partition walls through a film forming process.

The moisture absorption layer may be formed of a hygroscopic oxide material such as calcium oxide (CaO) or barium oxide (BaO) or other hygroscopic insulating materials. Additionally, one of an inkjet method, a roll printing method, a screen printing method, and a bar coating method may be used for coating the source material. A mask may be used during the step, in which the mask has an opening corresponding to an upper surface of the partition wall (in the single structure) or the standoff area between the sub partition walls (in the double structure).

At step ST4, the first and second substrates are faced such that the connection pattern corresponds to the organic electroluminescent diode, and then are attached. Before attaching the substrates, a seal pattern is formed on one of the first and second substrates in peripheral regions. Therefore, the peripheral portions of the first and second substrates are sealed by the seal pattern during the attaching step.

The inside of the first and second substrates is made vacuous through the attaching step. The moisture absorption layer removes moisture that may remain in or enter the device to thereby increase the lifespan of the device and reduce problems. Moreover, since the moisture absorption layer is formed in a partition wall region, no additional space is required to install the moisture absorption element.

As described below, the moisture absorption layer may be formed on a substrate including a thin film transistor.

Figure 8:
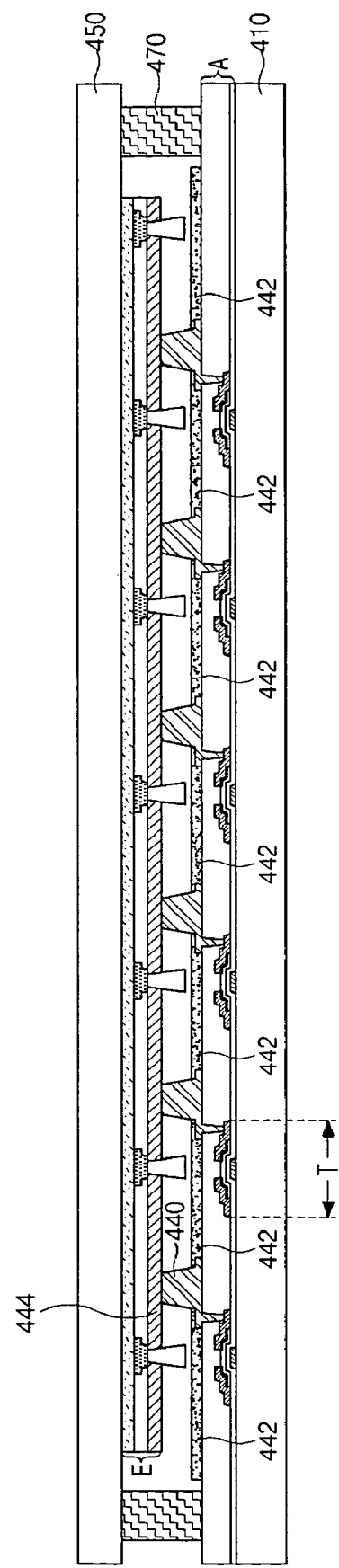
FIG. 8 is a cross-sectional view of a dual panel type organic electroluminescent display device according to a fourth embodiment of the present invention.

FIG. 8 is a cross-sectional view of a dual panel type OELD device according to a fourth embodiment of the present invention. The parts different from the first embodiment will be mainly explained.

As illustrated in FIG. 8, the dual panel type OELD device includes a first substrate 410 and a second substrate 450 that are spaced apart and face each other. An array element layer A including a thin film transistor T is formed on an inner surface of the first substrate 410. A connection pattern 440 connected to the thin film transistors T is formed on the array element layer A.

An organic electroluminescent diode E is formed on an inner surface of the second substrate 450 and is connected to the connection pattern 440. A seal pattern 470 is formed along peripheral portions of the first and second substrates 410 and 450. The organic electroluminescent diode E has the same structure as that of the previous embodiments.

In the related art, the inside of the OELD device may be filled with nitrogen gas (N2). In contrast, the inside of the dual panel type OELD device may be vacuum.

A moisture absorption layer 442 is formed over the first substrate 410, and covers all regions except the connection pattern 440 so that the moisture absorption layer 442 may not interrupt the electrical connection of the connection pattern 440 and the organic electroluminescent diode E. The moisture absorption layer 442 is disposed inside the seal pattern 470.

The moisture absorption layer 442 may be formed of an insulating material having a hygroscopic property. The moisture absorption layer 442 may be formed of calcium oxide (CaO) or barium oxide (BaO). The moisture absorption layer 442 may be formed by one of an inkjet method, a roll printing method, a screen printing method, and a bar coating method using a source material of a liquid phase.

Figure 9:
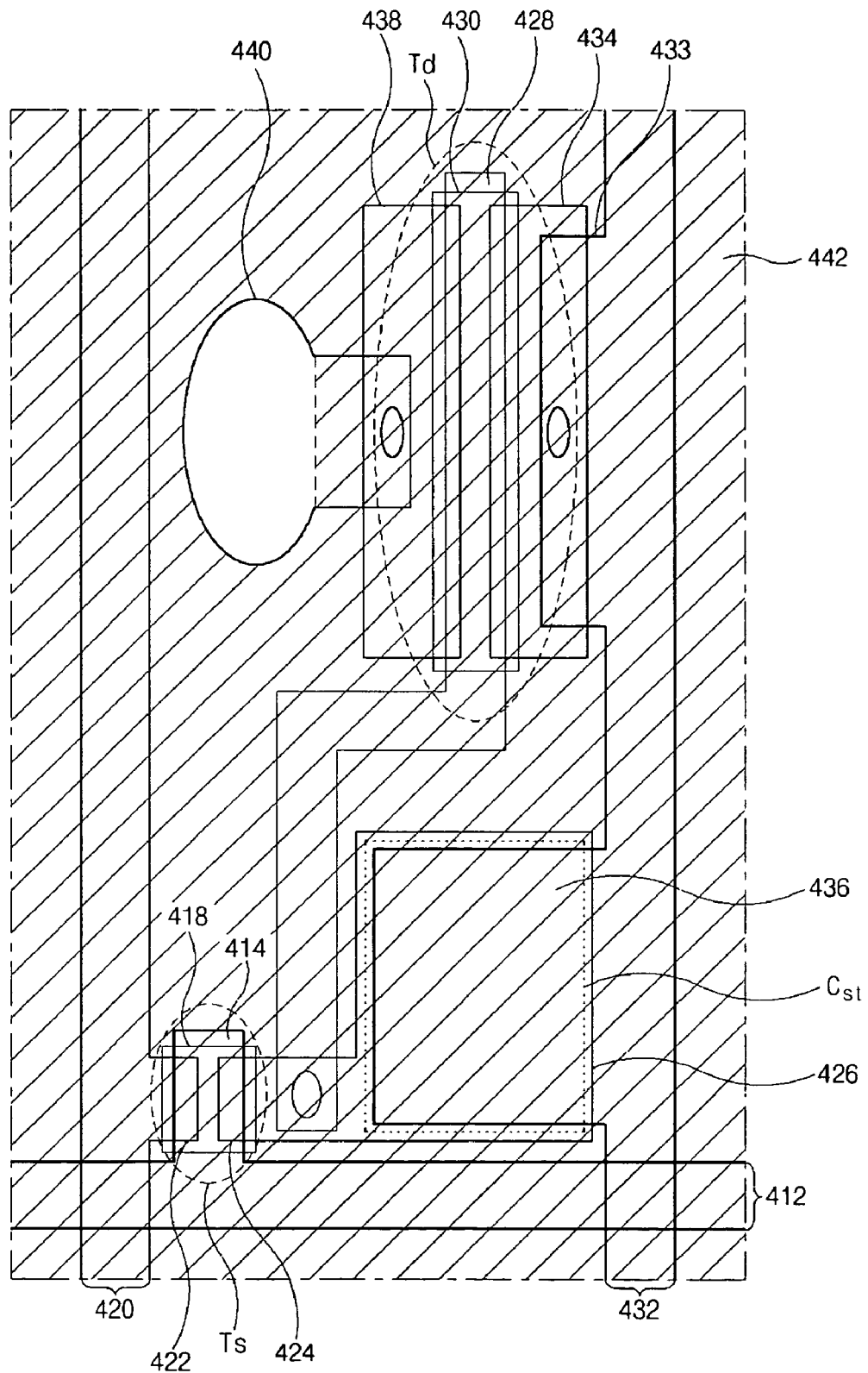
FIG. 9 is a plan view illustrating a lower substrate for the dual panel type organic electroluminescent display device of FIG. 8.

FIG. 9 is a plan view illustrating a lower substrate for the dual panel type OELD device of FIG. 8. As shown in FIG. 9, a gate line 412 is formed in a first direction on a substrate, and a data line 420 and a power line 432 are formed in a second direction crossing the first direction and are spaced apart from each other. A switching thin film transistor Ts is formed at a crossing portion of the gate line 412 and the data line 420.

The switching thin film transistor Ts includes a first gate electrode 414 that extends from the gate line 412, a first source electrode 422 that extends from the data line 420, a first drain electrode 424 that is spaced apart from the first source electrode 422, and a first semiconductor layer 418. The first semiconductor layer 418 overlaps the first gate electrode 414, the first source electrode 422 and the first drain electrode 424, and has an island pattern shape.

A second gate electrode 428 is connected to the first drain electrode 424, and a second semiconductor layer 430 covers the second gate electrode 428. A second source electrode 434 and a second drain electrode 438 are spaced apart from each other over the second semiconductor layer 430. The second source electrode 434 and the second drain electrode 438 have island pattern shapes. A power electrode 433 extends from the power line 432 and is connected to the second source electrode 434. The second gate electrode 428, the second semiconductor layer 430, the second source electrode 434, and the second drain electrode 438 constitute a driving thin film transistor Td.

A first capacitor electrode 426 extends from the first drain electrode 424 and a second capacitor electrode 436 extends from the power line 432. The first capacitor electrode 426 and the second capacitor electrode 436 overlap each other to form a storage capacitor Cst with an insulating layer therebetween.

A connection pattern 440 is connected to the second drain electrode 438, and a moisture absorption layer 442 is formed on an entire surface of a hatched region, which excludes the connection pattern 440, as shown in FIG. 9. Because the moisture absorption layer 442 is formed on the substrate including the connection pattern 440, the moisture absorption layer 442 may cover a connecting portion of the connection pattern 440 connected to the drain electrode 438.

As stated above, the moisture absorption layer 442 is formed of an oxide material such as calcium oxide (CaO) and barium oxide (BaO) or a liquid type insulating material having a hygroscopic property. Thus, the moisture absorption layer 442 may be formed to cover the gate line 412, the data line 420, the power line 432, the switching thin film transistor Ts, and the driving thin film transistor Td.

The hygroscopic ability of the moisture absorption layer 442 is proportional to its size. In this embodiment, since the moisture absorption layer 442 is formed over the entire surface of the substrate except the regions corresponding to the connection patterns 440, the hygroscopic ability in the dual panel type OELD device is improved.

As described below, a dual panel type OELD device of the present invention may include an additional full color element and an organic light-emitting layer of a monochromatic luminous material.

Figure 10:
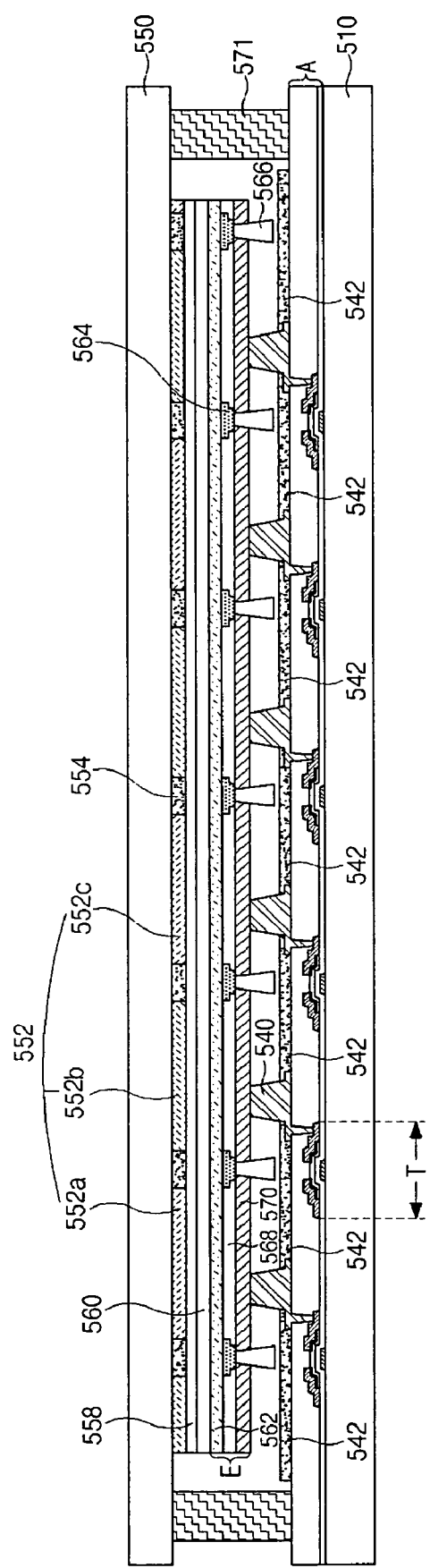
FIG. 10 is a cross-sectional view of a dual panel type organic electroluminescent display device according to a fifth embodiment of the present invention.

FIG. 10 is a cross-sectional view of a dual panel type OELD device according to a fifth embodiment of the present invention. The dual panel type OELD device includes a color filter layer as the full color element.

As shown in FIG. 10, a first substrate 510 and a second substrate 550 are spaced apart from and facing each other. A color filter layer 552 and a black matrix 554 are formed on an inner surface of the second substrate 550. The color filter layer 552 includes red, green and blue sub-color filters 552a, 552b and 552c, and the black matrix 554 is disposed between adjacent sub-color filters 552a, 552b and 552c of the color filter layer 552. An overcoat layer 558 and a barrier layer 560 are sequentially formed on the color filter layer 552 and the black matrix 554. The overcoat layer 558 planarizes a surface of the second substrate 550 including the color filter layer 552 and the black matrix 554. The barrier layer 560 prevents outgassing from the color filter layer 552.

A first electrode 562 is formed on the barrier layer 560, and an insulating pattern 564 and a partition wall 566 are sequentially formed on the first electrode 562 in a non-pixel area. The partition wall 566 has reversely tapered sides and a certain thickness. An organic light-emitting layer 568 and a second electrode 570 are sequentially formed on the first electrode 562 between adjacent partition walls 566 and between adjacent insulating patterns 564. The organic light-emitting layer 568 and the second electrode 570 are automatically patterned due to the partition wall 566, and do not require additional patterning processes.

The organic light-emitting layer 568 is formed of a monochromatic luminous material, which may emit white light, for example.

The first electrode 562, the second electrode 570, and the organic light-emitting layer 568 constitute an organic electroluminescent diode E.

An array element layer A including a thin film transistor T is formed on an inner surface of the first substrate 510. A connection pattern 540 is formed on the array element layer A and is connected to the thin film transistor T. The connection pattern 540 also contacts the second electrode 570 and electrically connects the thin film transistor T to the organic electroluminescent diode E.

A moisture absorption layer 542 is formed over an entire surface of the first substrate 510 inside a seal pattern 571, and covers the array element layer A except the regions corresponding to the connection patterns 540.

A double structure of a color filter layer and color-changing mediums (CCM) may be used as the full color element. In such a case, the organic light-emitting layer emits only substantially monochromatic light of a substantially single wavelength. For example, the organic light-emitting layer emits blue light.

Figure 11:
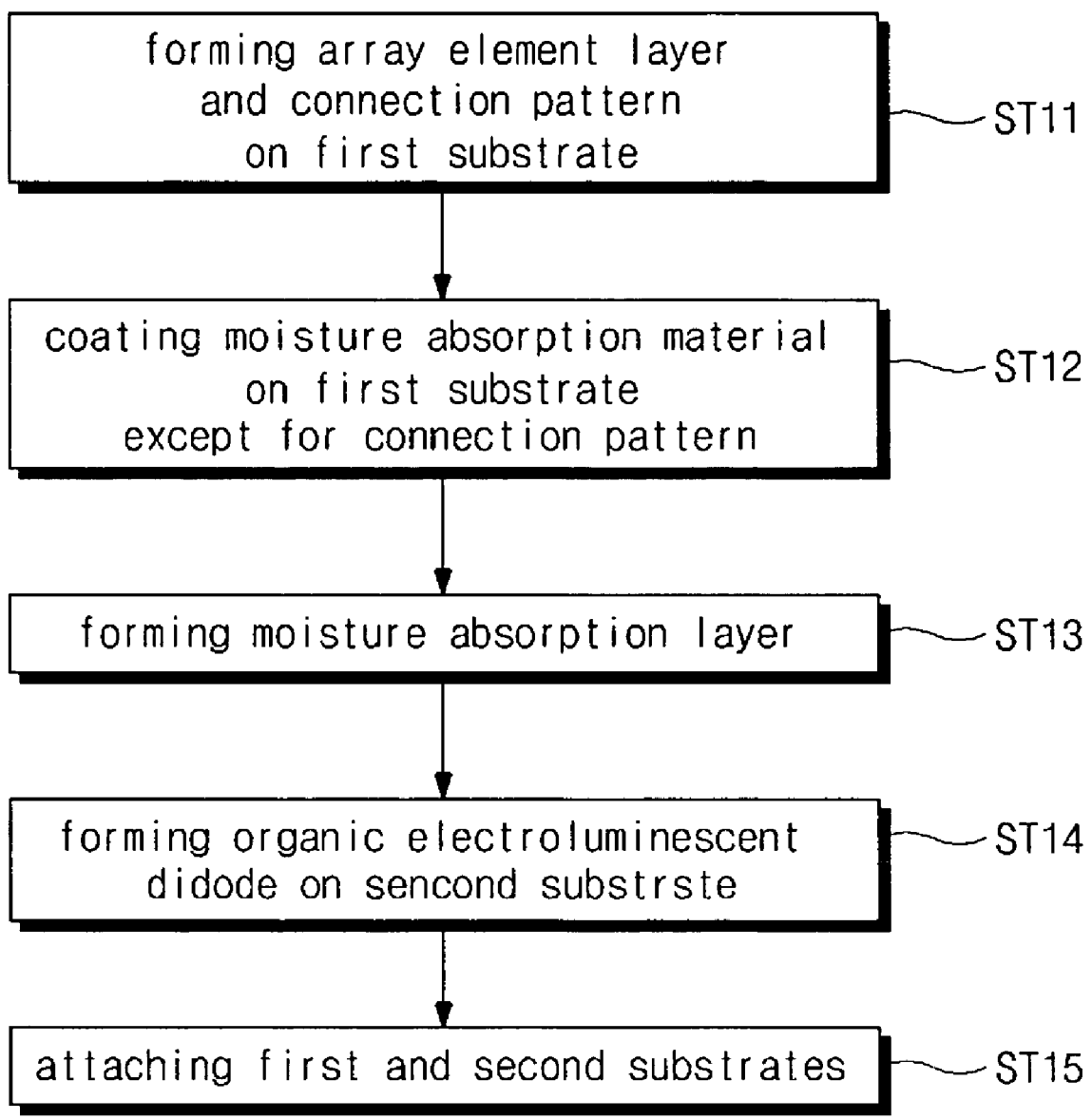
FIG. 11 is a flow chart illustrating a manufacturing process of another example of a dual panel type organic electroluminescent display device according to the present invention.

FIG. 11 is a flow chart illustrating a manufacturing process of an example of a dual panel type OELD device according to the present invention.

At step ST11, an array element layer including a thin film transistor is formed on a first substrate and a connection pattern is formed on the array element layer. The connection pattern is connected to the thin film transistor.

The array element layer also includes a gate line, a data line, a power line, and a storage capacitor. The thin film transistor include a switching thin film transistor that is formed at a crossing portion of the gate and data line and a driving thin film transistor that is connected to a drain electrode of the switching thin film transistor and the power line.

At step ST12, a mask is disposed over the first substrate including the connection pattern, in which the mask has an opening except the region corresponding to the connection pattern. Next, a moisture absorption material of a liquid phase is coated on the first substrate through the opening of the mask by using an ink-jet method. The moisture absorption material is coated inside a seal pattern, which is to be formed at the periphery. Besides the ink-jet method, one of a roll printing method, a screen printing method and a bar coating method may be used.

At step ST13, a moisture absorption layer is formed by curing the coated moisture absorption material.

At step ST14, an organic electroluminescent diode is formed on a second substrate. The organic electroluminescent diode includes a first electrode, a second electrode, and an organic light-emitting layer interposed therebetween.

At step ST15, a seal pattern is formed in a peripheral portion of one of the first and second substrates, and then the first and second substrates are attached through the seal pattern. In this step, the connection pattern is electrically connected to the organic electroluminescent diode, and the cavity defined by the first and second substrates is made vacuous.

In the above examples, the thin film transistor has an inverted staggered structure and includes amorphous silicon. However, the thin film transistor may have a top gate structure using polycrystalline silicon.

As described below, the moisture absorption layer may be formed of a conductive material.

Figure 12A:
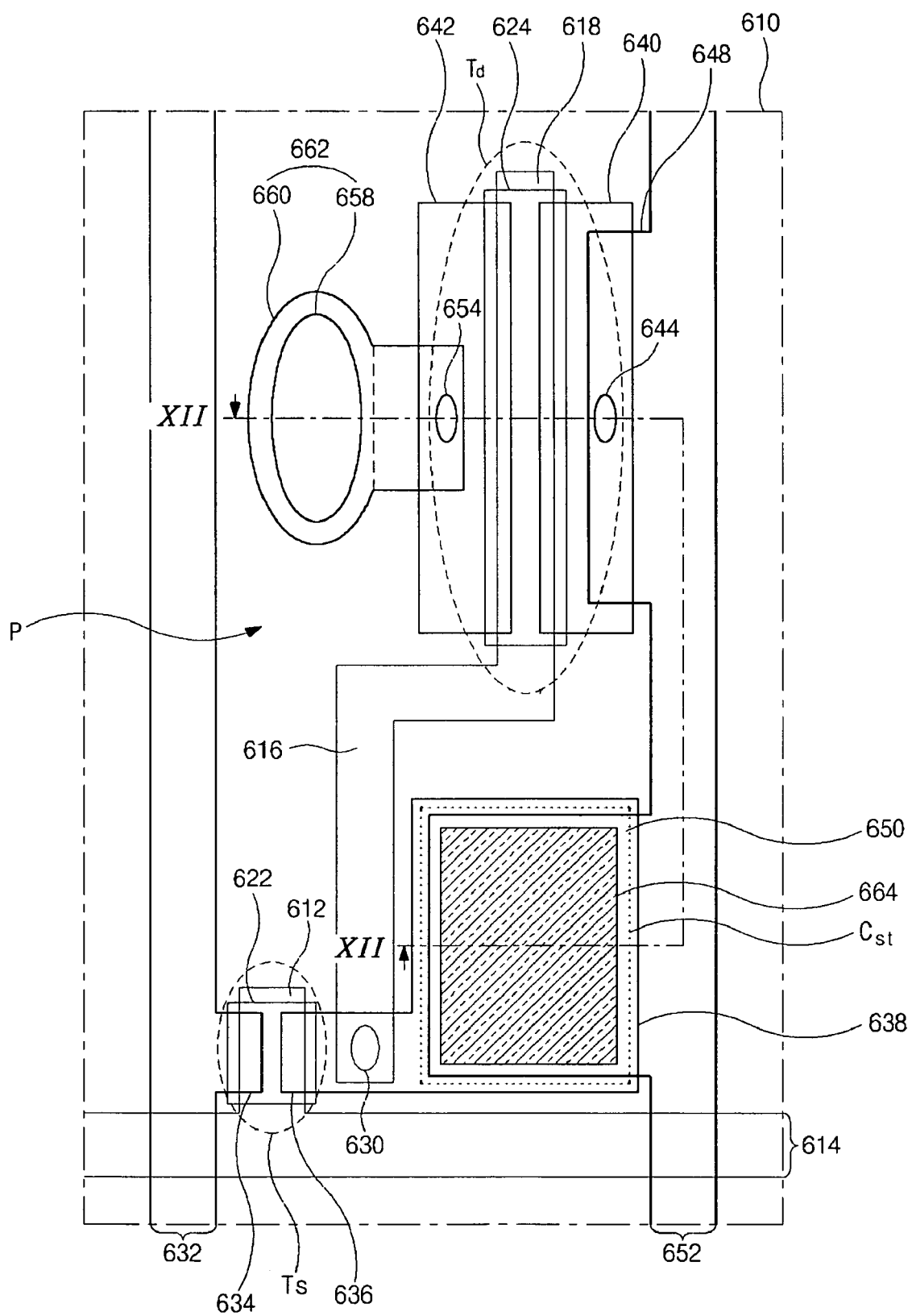
FIG. 12A is a plan view illustrating a substrate for a dual panel type organic electroluminescent display device according to a sixth embodiment of the present invention.
Figure 12B:
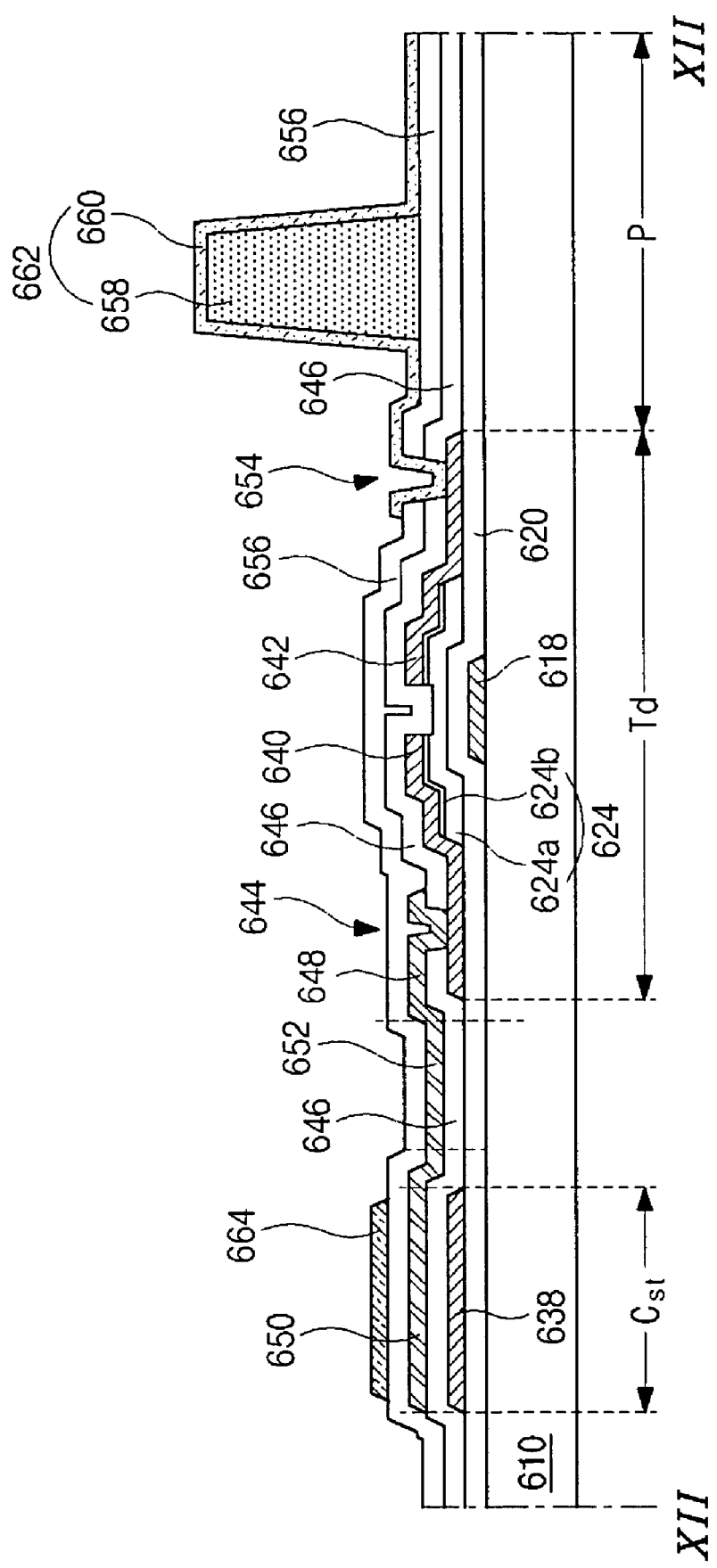
FIG. 12B is a cross-sectional view along the line XII-XII of FIG. 12A.

FIG. 12A is a plan view illustrating a substrate for a dual panel type OELD device according to a sixth embodiment of the present invention and FIG. 12B is a cross-sectional view along the line XII-XII of FIG. 12A. The sixth embodiment enables use of a moisture absorption layer that is made of an electrically conductive material.

As shown in FIGS. 12A and 12B, a gate line 614 is formed in a first direction on a substrate 610, and a first gate electrode 612 extends from the gate line 614. A connection line 616 of an island pattern shape is formed in a second direction and is spaced apart from the first gate electrode 612 and the gate line 614. The connection line 616 has bent portions. One end of the connection line 616 is located adjacent the fist gate electrode 612. A second gate electrode 618 extends from the connection line 616.

A gate insulating layer 620 covers the first gate electrode 612, the gate line 614, the connection line 616, and the second gate electrode 618. A first semiconductor layer 622 and a second semiconductor layer 624 are formed on the gate insulating layer 620 over the first gate electrode 612 and the second gate electrode 618, respectively. The second semiconductor layer 624 includes an active layer 624a of undoped amorphous silicon and an ohmic contact layer 624b of doped amorphous silicon. The first semiconductor layer 622 has the same structure as the second semiconductor layer 624. The gate insulating layer 620 has a first contact hole 630 exposing a part of the connection line 616.

A data line 632 and the first capacitor electrode 638 are formed on the gate insulating layer 620. The data line 632 is formed in the second direction crossing the first direction and includes a first source electrode 634. The first drain electrode 636 is spaced apart from the first source electrode 634 and is connected to the connection line 616 through the first contact hole 630. The first drain electrode 636 and the first source electrode 634 overlap the first semiconductor layer 622 at the respective sides. The first capacitor electrode 638 extends from the first drain electrode 636.

A second source electrode 640 and a second drain electrode 642 are formed on the second semiconductor layer 624. The second source electrode 640 and the second drain electrode 642 have island pattern shapes and overlap the respective sides of the second semiconductor layer 624.

The first gate electrode 612, the first semiconductor layer 622, the first source electrode 634, and the first drain electrode 636 constitute a switching thin film transistor Ts. The second gate electrode 618, the second semiconductor layer 624, the second source electrode 640, and the second drain electrode 642 constitute a driving thin film transistor Td.

The switching thin film transistor Ts controls voltage applied to the second gate electrode of the driving thin film transistor Td in accordance with the voltages applied to the gate line 614 and the data line 632. As a result, the driving thin film transistor Td controls the brightness of emission light through controlling a current through the power line 652 in accordance with the voltages applied to the switching thin film transistor Ts.

A first passivation layer 646 covers the switching thin film transistor Ts and the driving thin film transistor Td. The first passivation layer 646 has a second contact hole 644 exposing a part of the second source electrode 640.

A power line 652 is formed in the second direction on the first passivation layer 646 and is spaced apart from the data line 632. A power electrode 648 and a second capacitor electrode 650 extend from the power line 652. The power electrode 648 is connected to the second source electrode 640 through the second contact hole 644. The second capacitor electrode 650 overlaps the first capacitor electrode 638. The first and second capacitor electrodes 638 and 650 constitute a storage capacitor Cst with the first passivation layer 646 interposed therebetween.

A pixel area P is defined by crossing of the gate line 614, the data line 632 and the power line 652.

A second passivation layer 656 covers the power line 652, the power electrode 648 and the second capacitor electrode 650. The second passivation layer 656 has a third contact hole 654 exposing a part of the second drain electrode 642 through the first passivation layer 646. A projecting pattern 658 of a predetermined thickness is formed on the second passivation layer 656 in the pixel area P. The projecting pattern 658 is located adjacent the third contact hole 654. A connection electrode 660 covers the projecting pattern 658, and is connected to the second drain electrode 642 through the third contact hole 654. The projecting pattern 658 and the connection electrode 660 constitute a connection pattern 662.

A moisture absorption layer 664 is formed on the second passivation layer 656 over the storage capacitor Cst. The moisture absorption layer 664 may be made of a hygroscopic metal material that can remove moisture of the device.

In this embodiment, if the moisture absorption layer 664 is made of a metal material, which has a thin film form through a depositing process, the moisture absorption layer 664 preferably should not be formed over the thin film transistors and the metal lines, such as the gate line, the data line, and the power line. More specifically, if the electrically conductive moisture absorption layer 664 is formed over the thin film transistor or the metal lines, a parasitic capacitor may form to cause a signal delay or poor images. Accordingly, it is desirable to form the moisture absorption layer in a region where there is no the thin film transistor or the metal lines underneath, such as where the storage capacitance is located as in this example.

The hygroscopic metal material that can be used in the present embodiment may be a getter material that improves the degree of vacuum and removes the moisture. The getter material may include an element of group 4 such as zirconium (Zr), titanium (Ti) and hafnium (Hf), an element of group 5 such as vanadium (V), niobium (Nb) and tantalum (Ta), an element of group 6 such as chromium (Cr), molybdenum (Mo) and tungsten (W), an element of group 8 such as iron (Fe), ruthenium (Ru) and osmium (Os), an element of group 10 such as nickel (Ni), or an element of group 9 such as cobalt (Co), where the scheme used for the group label is numeric and follows the current IUPAC (International Union of Pure and Applied Chemistry) convention. The getter material may also include elements of groups 1, 11, 13, 15, 16, 17, or 18. The hygroscopic metal material may be formed by a sputtering method or an evaporation method, for example.

Figure 13:
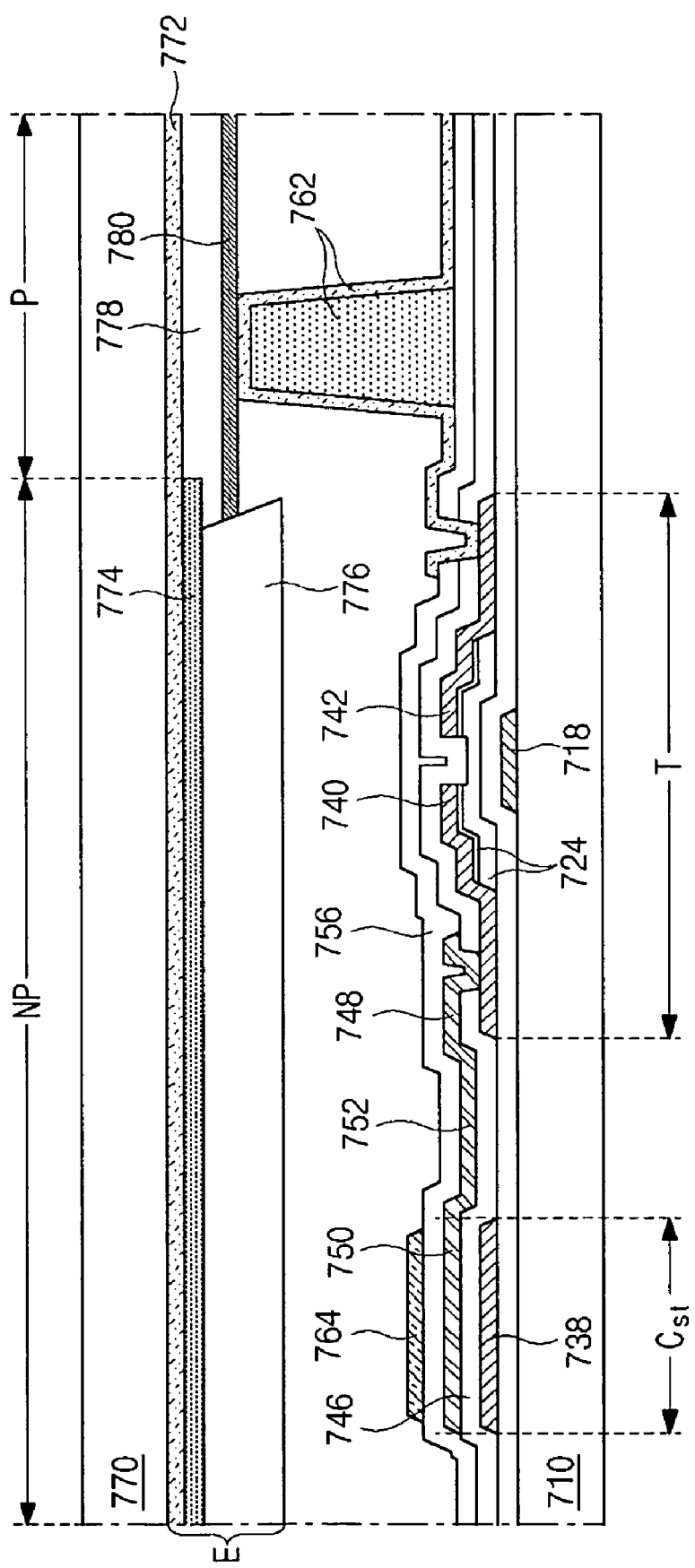
FIG. 13 is a cross-sectional view of a dual panel type organic electroluminescent display device according to the sixth embodiment of the present invention.

FIG. 13 is a cross-sectional view of a dual panel type OELD device according to the sixth embodiment of the present invention. The same parts as in FIG. 12B may be briefly explained.

As shown in FIG. 13, a first substrate 710 and a second substrate 750 are spaced apart from and facing each other. A thin film transistor T is formed on an inner surface of the first substrate 710. The thin film transistor T includes a gate electrode 718, a semiconductor layer 724, a source electrode 740 and a drain electrode 742. A first capacitor electrode 738 is formed of the same material and in the same layer as the source and drain electrodes 740 and 742. A power line 752 is formed on a first passivation layer 746. The power line 752 includes a power electrode 748 and a second capacitor electrode 750. The power electrode 748 is connected to the source electrode 740, and the second capacitor electrode 750 overlaps the first capacitor electrode 738. The first and second capacitor electrodes 738 and 750 constitute a storage capacitor Cst with the first passivation layer 746 therebetween.

A second passivation layer 756 covers the storage capacitor Cst and the thin film transistor T, and a connection pattern 762 is formed on the second passivation layer 756. The connection pattern 762 is connected to the thin film transistor T. A moisture absorption layer 764 is formed on the second passivation layer 756 at a location corresponding to the storage capacitor Cst.

A first electrode 772 is formed on an entire inner surface of the second substrate 770. An insulating pattern 774 and a partition wall 776 are sequentially formed on the first electrode 772 in a non-pixel area NP. The partition wall 766 has reversely tapered sides with respect to the second substrate 770 and has a certain thickness. An organic light-emitting layer 778 and a second electrode 780 are sequentially formed on the first electrode 772 between adjacent partition walls 776 and between adjacent insulating patterns 774. The organic light-emitting layer 778 and the second electrode 780 are automatically patterned due to the partition wall 776 without additional patterning processes. The second electrode 780 contacts the connection pattern 762.

The first electrode 772, the second electrode 780, and the organic light-emitting layer 778 constitute an organic electroluminescent diode E. The first electrode 772 is transparent, and thus the device has a top emission mode. For example, the first electrode 772 may be an anode electrode and the second electrode 780 may be a cathode electrode. In this case, the first electrode 772 may be formed of a transparent conductive material such as indium tin oxide (ITO).

Although not shown in FIG. 13, the organic light-emitting layer 778 may be formed as an independent luminescent method, where red, blue green luminous layers are sequentially formed at the respective pixels. Alternatively, a monochromatic luminous layer may be used as the organic light-emitting layer, and a single structure of a color filter layer or a double structure of a color filter layer and color-changing mediums (CCM) may be used as a full color element.

In embodiments of the present invention, since the array element and the organic electroluminescent diode are formed on different substrates, the yield and productivity are improved and the life span of the device is increased.

The dual panel type OELD device has a high aperture ratio and high definition images because it can be operated in the top emission mode. In addition, because the organic light-emitting layer and the second electrode are automatically patterned due to the partition wall without a shadow mask, the efficiency of the manufacturing process is improved. Moreover, since the moisture absorption layer is formed on one of the top and bottom substrates, degradation of the device due to moisture can be prevented, and efficient usage of the space is achieved.

It will be apparent to those skilled in the art that various modifications and variations can be made in the organic electroluminescent display device and the method of fabricating the same of the present invention without departing from the spirit or scope of the invention. Thus, it is intended that the present invention covers the modifications and variations of this invention provided they come within the scope of the appended claims and their equivalents.

What is claimed is:

1. A dual panel type organic electroluminescent display device, comprising:
    first and second substrates facing and spaced apart from each other;
    an array element layer on an inner surface of the first substrate and including a thin film transistor;
    a connection pattern on the array element layer and electrically connected to the thin film transistor;
    a moisture absorption layer covering the array element layer and exposing the connection pattern;
    an organic electroluminescent diode on an inner surface of the second substrate and electrically connected to the connection pattern, wherein the moisture absorption layer is disposed between the array element layer and the organic electroluminescent diode; and
    a seal pattern between the first and second substrates along a peripheral portion,
    wherein the moisture absorption layer covers substantially the entire array element layer except the exposed portions of the connection pattern so as to connect the thin film transistor to the organic electroluminescent diode.

2. The device according to claim 1, wherein an inside of the seal pattern between the first and second substrates is substantially vacuum.

3. The device according to claim 2, wherein the moisture absorption layer is formed of an insulating material absorbing moisture and gases.

4. The device according to claim 3, wherein the insulating material includes oxide.

5. The device according to claim 3, wherein the insulating material includes at least one of calcium oxide and barium oxide.

6. The device according to claim 1, wherein the moisture absorption layer is disposed inside the seal pattern.

7. The device according to claim 1, wherein the organic electroluminescent diode includes an organic light-emitting layer composed of separate red, green and blue luminous layers.

8. The device according to claim 1, further comprising a color filter layer between the organic electroluminescent diode and the second substrate, wherein an organic light-emitting layer of the organic electroluminescent diode emits substantially monochromatic light.

9. The device according to claim 8, further comprising color-changing mediums between the organic electroluminescent diode and the second substrate.

10. The device according to claim 1, wherein the organic electroluminescent diode includes a first electrode, an organic light-emitting layer, a second electrode, and a partition wall, the first electrode being disposed on an entire surface of the second substrate, the partition wall having reversely tapered sides, boundaries of the organic light-emitting layer and the second electrode being defined by the partition wall.

11. The device according to claim 1, wherein the thin film transistor functions as a driving thin film transistor, which provides the organic electroluminescent diode with an electric current.

12. The device according to claim 1, wherein the array element layer includes a plurality of gate lines formed in a first direction, a plurality of data lines crossing the plurality of gate lines, a plurality of power lines parallel to the plurality of data lines, a switching thin film transistor at each crossing of the gate and data lines, and a driving thin film transistor connected to a drain electrode of the switching thin film transistor and the corresponding power line,
    wherein the connection pattern is connected to a drain electrode of the driving thin film transistor, and
    wherein the moisture absorption layer covers the plurality of gate lines, data lines and power lines, the switching thin film transistor and the driving thin film transistor.

13. The device according to claim 1, wherein a portion of the connection pattern is covered by the moisture absorption layer and a remaining portion of the connection pattern protrudes through the moisture absorption layer to connect the thin film transistor to the organic electroluminescent diode.

* * * * *